(12) United States Patent
Huang et al.

(10) Patent No.: US 9,767,985 B2
(45) Date of Patent: Sep. 19, 2017

(54) DEVICE AND METHOD FOR OPTIMIZING DIFFUSION SECTION OF ELECTRON BEAM

(71) Applicant: HUAZHONG UNIVERSITY OF SCIENCE AND TECHNOLOGY, Wuhan (CN)

(72) Inventors: Jiang Huang, Wuhan (CN); Mingwu Fan, Wuhan (CN); Tiaoqin Yu, Wuhan (CN); Lige Zhang, Wuhan (CN); Chen Zuo, Wuhan (CN); Jun Yang, Wuhan (CN); Yongqian Xiong, Wuhan (CN); Kaifeng Liu, Wuhan (CN); Gerald F. Wu, Alexandria, VA (US); Lei Cao, Wuhan (CN)

(73) Assignee: Huazhong University of Science and Technology, Wuhan (CN)

( * ) Notice: Subject to any disclaimer, the term of this patent is extended or adjusted under 35 U.S.C. 154(b) by 0 days.

(21) Appl. No.: 14/895,708

(22) PCT Filed: Oct. 17, 2014

(86) PCT No.: PCT/CN2014/088830
§ 371 (c)(1),
(2) Date: Dec. 3, 2015

(87) PCT Pub. No.: WO2015/188554
PCT Pub. Date: Dec. 17, 2015

(65) Prior Publication Data
US 2016/0189914 A1 Jun. 30, 2016

(30) Foreign Application Priority Data
Sep. 15, 2014 (CN) .................. 2014 1 04699655

(51) Int. Cl.
*H01J 37/143* (2006.01)
*H01J 3/12* (2006.01)
(Continued)

(52) U.S. Cl.
CPC ............ *H01J 37/143* (2013.01); *G21K 1/093* (2013.01); *G21K 5/04* (2013.01); *H01J 3/12* (2013.01);
(Continued)

(58) Field of Classification Search
CPC ........................................ H01J 37/143
See application file for complete search history.

(56) References Cited

U.S. PATENT DOCUMENTS 3,943,698 A * 3/1976 Ono ................. G04C 13/11
310/156.12
5,420,556 A * 5/1995 Okazaki ............. H01F 7/0284
335/210
(Continued)

FOREIGN PATENT DOCUMENTS

CN 101057731 10/2007
CN 102097150 6/2011
(Continued)

OTHER PUBLICATIONS

Chinese Office Action, issued in the corresponding Chinese Application No. 201410469965.5, dated Jan. 21, 2015, 12 pages.

*Primary Examiner* — Jason McCormack
*Assistant Examiner* — James Choi
(74) *Attorney, Agent, or Firm* — Hamre, Schumann, Mueller & Larson, P.C.

(57) ABSTRACT

Provided is a device for optimizing a diffusion section of an electron beam, comprising two groups of permanent magnets, a magnetic field formed by the four magnetic poles extending the electron beam in a longitudinal direction, and compressing the electron beam in a transverse direction, so that the electron beam becomes an approximate ellipse; another magnetic field formed by the eight magnetic poles optimizing an edge of a dispersed electron-beam bunch into an approximate rectangle; by controlling the four longitu- (Continued)

(a)

(b)

dinal connection mechanisms so that the upper magnetic yoke and the lower magnetic yoke of the first group of permanent magnets move synchronously towards the center thereof thereby longitudinally compressing the electron beam in the shape of an approximate ellipse, and the upper magnetic yoke and the lower magnetic yoke of the second group of permanent magnets move synchronously towards the center thereof thereby longitudinally compressing the electron beam in the shape of an approximate rectangle, and the process of longitudinal compression is repeated until a longitudinal size of the electron-beam bunch is reduced to 80 mm. The invention is capable of reasonably compressing a longitudinal size of an electron-beam bunch after diffusion to approximately 80 mm, which ensures optimum irradiation uniformity and efficiency, and enables the longitudinal size to be within the range of a conventional titanium window.

5 Claims, 5 Drawing Sheets (51) Int. Cl.
*G21K 1/093* (2006.01)
*G21K 5/04* (2006.01)

(52) U.S. Cl.
CPC ............... *H01J 2237/0835* (2013.01); *H01J 2237/1405* (2013.01); *H01J 2237/152* (2013.01)

(56) References Cited

U.S. PATENT DOCUMENTS

| | | | |
|---|---|---|---|
| 5,576,679 A * | 11/1996 | Ohashi | H01J 23/10 315/5.35 |
| 7,026,636 B2 | 4/2006 | Yanagisawa et al. | |
| 2004/0090166 A1* | 5/2004 | Sanders | H01J 35/14 313/448 |
| 2013/0134322 A1* | 5/2013 | Yasuda | B82Y 10/00 250/396 ML |

FOREIGN PATENT DOCUMENTS

| | | | |
|---|---|---|---|
| CN | 102097150 B | * | 7/2012 |
| CN | 103079641 | | 5/2013 |
| CN | 103489496 | | 1/2014 |
| JP | S5088516 | | 7/1975 |
| JP | 04230899 A | * | 8/1992 |
| JP | 2004165162 | | 6/2004 |
| JP | 5148014 | | 2/2013 |
| KR | 1019980004677 | | 3/1998 |

* cited by examiner

DEVICE AND METHOD FOR OPTIMIZING DIFFUSION SECTION OF ELECTRON BEAM

FIELD OF THE INVENTION

The invention relates to the field of irradiation processing using an electron beam, and more particularly, to a device and a method for optimizing a diffusion section of an electron beam.

DESCRIPTION OF THE RELATED ART

As nuclear radiation is applied to materials, the materials are ionized or excited and emit orbital electrons forming free radicals, which change the materials into new materials by varying physical or chemical composition thereof, or cause loss or failure of organisms (microorganisms and so on), and thus facilitating irradiation sterilization. An irradiation-based method for processing products and improving performance thereof is referred to as irradiation processing. Different from conventional mechanical processing or hot processing, high energy electrons or γ rays in irradiation processing feature strong penetration capability, and can go deep into materials and conduct processing at a molecular level (which is essentially a nano processing technology). Processed objects are high energy rays and intermediates with high activity that are generated thereby. The irradiation processing features low power consumption, no residue, and small amount of pollution since it is thermal motion of molecules generating no heat effect, and thus is widely used in the fields of industry, agriculture, medical science, biology, as well as environmental protection.

There are two types of radiation source for irradiation processing: radioisotopes such as cobalt source, and charged particle accelerators such as electron accelerators. Advantages of the electron accelerators are that energy thereof is controllable, electron beams are directly applied to a radiated product and thus utilization efficiency of the accelerators is high, there is no need for treating spent radiation source, they do not consume power as being shut down, and they almost bring about no pollution to the environment since only very small amount of ozone during production. Therefore, the electron accelerators tend to be used by more and more users in irradiation processing.

Figure 1:
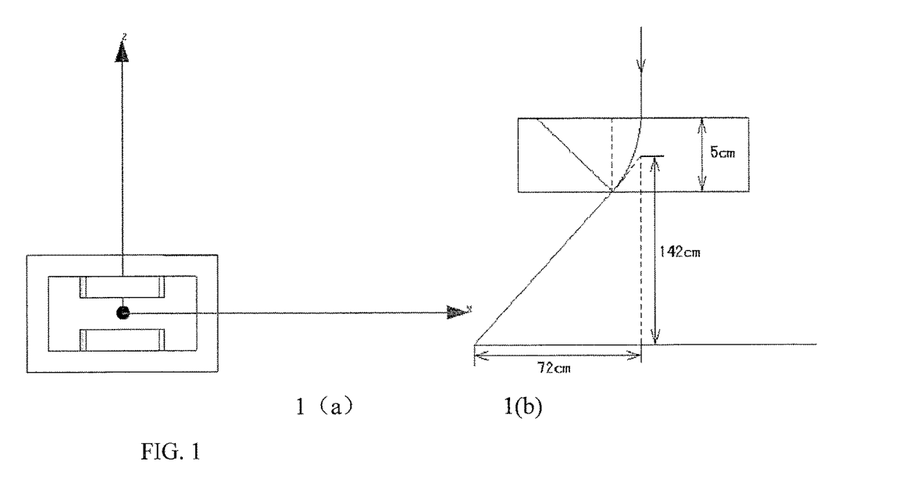
FIG. 1 illustrates a conventional scanning magnet.

A diameter of a spot of an electron beam bunch accelerated by the electron accelerator is normally around 1 cm, a power of electron beam current is approximately 10-50 KW (in some cases may be up to 100 KW), energy of the electron beam is concentrated in a range that is not big enough, which makes it impossible to be used for irradiation processing products since centralized energy may cause damage thereof or un-uniformity of irradiation dose. Therefore, a device for diffusing the electron beam must be used after the electron beam leaves the electron accelerator and before the electron beam reaches an object. At present, a scanning magnet is used. The magnet is powered by a saw tooth wave power source, and transversely scans the electron beam (similar to row scanning of TVs). A device under the electron beam forces a radiated object to longitudinally pass through the electron beam with a uniform speed (similar to frame scanning of TVs), so that the object is processed with uniform irradiation dose, which basically solves the above-mentioned problem. FIG. 1(a) is a schematic view of a scanning magnet with energy of 0.5 MeV and a current intensity of 50 mA, and FIG. 1(b) illustrates principle of the scanning magnet.

However, there are several problems with the electron beam scanning method: it consumes electric power, and large heterogeneous products cannot be uniformly irradiated thereby. Moreover, flyback generated during scanning, and improper cooperation between a travel speed and a scanning frequency may cause un-uniformity of irradiation dose.

The inventor's Chinese patent No. ZL 201010532758.1 named 'DEVICE FOR DIFFUSING ELECTRON BEAM IN IRRADIATION PROCESSING' theoretically raises a solution for solving the above-mentioned problems with the conventional electron beam scanning method, in which electron beams are uniformly diffused and then irradiated on a product without electric driving. Specifically, a first group of permanent magnets uniformly diffuse the electron beams, and a second group of permanent magnets reshape periphery of the electron beam. However, this solution has the following two disadvantages in application:

(1) the inventor finds that an electron-beam bunch formed in the above-mentioned patent is uniformly distributed within a range of 1000 mm (length)*400 mm (width). But in practice, if all electron beams use this scanning method, a longitudinal size of the electron beam after scanning will be approximately 10 mm. To broaden the electron beam and improve irradiation quality, longitudinal scanning is used, but the longitudinal size can only be increased to 30 mm, and a longitudinal size of a titanium window being used is normally within 100 mm. In contrast, a longitudinal size of a titanium window in the above-mentioned patent is greater than 400 mm, which means that if the solution in the patent is used, a device under the electron beam is to be largely modified, which hampers wide application thereof in irradiation processing and production.

(2) electron-beam bunches need to be uniformly distributed so as to prevent damage of products or un-uniformity of irradiation dose caused by centralized energy. As for the electron-beam bunches in the above-mentioned patent, they are distributed by transversely defocusing a magnetic field formed by magnetic poles and longitudinally focusing the magnetic field, and only if uniformity of the magnetic field is maintained can that of the electron-beam bunch be ensured. However, the patent does not teach clearly how to maintain the uniformity of the magnetic field.

SUMMARY OF THE INVENTION

In view of the above-described problems with a conventional device for diffusing an electron beam in irradiation processing, it is one objective of the invention to provide a device for optimizing a diffusion section of an electron beam that is capable of reasonably compressing a longitudinal size of an electron-beam bunch after diffusion to approximately 80 mm, which ensures optimum irradiation uniformity and efficiency, and enables the longitudinal size to be within the range of a conventional titanium window, To achieve the above objective, in accordance with one embodiment of the invention, there is provided a device for optimizing a diffusion section of an electron beam, comprising two groups of permanent magnets, a first group of permanent magnets comprising four magnetic poles fixed on an upper magnetic yoke and a lower magnetic yoke in pairs, a polarity of a magnetic pole being different from that of another magnetic pole adjacent or opposite thereto, a magnetic field formed by the four magnetic poles extending the electron beam in a longitudinal direction, and compressing the electron beam in a transverse direction, so that the electron beam becomes an approximate ellipse; a second group of permanent magnets comprising eight magnetic poles fixed on an upper magnetic yoke, a lower magnetic yoke, a left magnetic yoke, and a right magnetic yoke in pairs, a polarity of a magnetic pole being different from that of another magnetic pole adjacent or opposite thereto, a magnetic field formed by the eight magnetic poles optimizing an edge of a dispersed electron-beam bunch into an approximate rectangle; the device further comprises four longitudinal connection mechanisms, both ends of each of the upper magnetic yoke and the lower magnetic yoke of the first group of permanent magnets are respectively disposed on the left magnetic yoke and the right magnetic yoke via a longitudinal connection mechanism, both ends of each of the upper magnetic yoke and the lower magnetic yoke of the second group of permanent magnets are respectively disposed on the left magnetic yoke and the right magnetic yoke via another longitudinal connection mechanism; by controlling the four longitudinal connection mechanisms so that the upper magnetic yoke and the lower magnetic yoke of the first group of permanent magnets move synchronously towards the center thereof thereby longitudinally compressing the electron beam in the shape of an approximate ellipse, and the upper magnetic yoke and the lower magnetic yoke of the second group of permanent magnets move synchronously towards the center thereof thereby longitudinally compressing the electron beam in the shape of an approximate rectangle, and the process of longitudinal compression is repeated until a longitudinal size of the electron-beam bunch is reduced to 80 mm.

In a class of this embodiment, the device further comprises a supporting block disposed between adjacent magnetic poles on one side of the magnetic yoke, and operating to prevent the magnetic poles from deviation due to attractive force thereof.

In a class of this embodiment, the device further comprises four slide bars operating to correspondingly connect four corner points formed by the four magnetic yokes of the first group of permanent magnets with four corner points formed by the four magnetic yokes of the second group of permanent magnets, the first group of permanent magnets being fixed with respect to the slide bar, and the second group of permanent magnets being movable along the slide bar, thereby adjusting a distance between the first group of permanent magnets and the second group of permanent magnets; and a locking mechanism operating to fix the distance between the first group of permanent magnets and the second group of permanent magnets.

In a class of this embodiment, a groove is disposed at the surface of the magnetic yoke, and interference fit with one end of the magnetic pole for receiving the magnetic pole, the groove being fixed by attractive force between the magnetic pole and the magnetic yoke, and via a fixed mount made of aluminum alloy.

In a class of this embodiment, the device further comprises a pad disposed between the groove and the magnetic pole In a class of this embodiment, the longitudinal connection mechanism is facilitated by: an upper strip-form through hole and a lower strip-form through hole are disposed on the left magnetic yoke or the right magnetic yoke, and operate to respectively receive one end of each of the upper magnetic yoke and the lower magnetic yoke via screws, and calibration is labeled on the wall of the through holes, and allows determination of positions of the upper magnetic yoke and the lower magnetic yoke via a vernier caliper.

The other objective of the invention is to provide a method for optimizing a diffusion section of an electron beam using a device for optimizing a diffusion section of an electron beam that is capable of reasonably compressing a longitudinal size of an electron-beam bunch after diffusion to approximately 80 mm, which ensures optimum irradiation uniformity and efficiency, and enables the longitudinal size to be within the range of a conventional titanium window In accordance with another embodiment of the invention, there is provided a method for optimizing a diffusion section of an electron beam using a device for optimizing a diffusion section of an electron beam, the device comprising two groups of permanent magnets, a first group of permanent magnets comprising four magnetic poles fixed on an upper magnetic yoke and a lower magnetic yoke in pairs, a polarity of a magnetic pole being different from that of another magnetic pole adjacent or opposite thereto, a magnetic field formed by the four magnetic poles extending the electron beam in a longitudinal direction, and compressing the electron beam in a transverse direction, so that the electron beam becomes an approximate ellipse; a second group of permanent magnets comprising eight magnetic poles fixed on an upper magnetic yoke, a lower magnetic yoke, a left magnetic yoke, and a right magnetic yoke in pairs, a polarity of a magnetic pole being different from that of another magnetic pole adjacent or opposite thereto, a magnetic field formed by the eight magnetic poles optimizing an edge of a dispersed electron-beam bunch into an approximate rectangle, wherein the method comprises: forcing the upper magnetic yoke and the lower magnetic yoke of the first group of permanent magnets to move synchronously towards the center thereof thereby longitudinally compressing the electron beam in the shape of an approximate ellipse, and the upper magnetic yoke and the lower magnetic yoke of the second group of permanent magnets to move synchronously towards the center thereof thereby longitudinally compressing the electron beam in the shape of an approximate rectangle, and repeating the process of longitudinal compression until a longitudinal size of the electron-beam bunch is reduced to 80 mm.

Advantages of the invention comprise:

The invention employs two groups of permanent magnets to uniformly diffuse, reshape and longitudinally compress the electron beam, so that the longitudinal size thereof is close to 80 mm, which on the one hand ensures uniformity and optimum efficiency of irradiation, and on the other hand, enables the longitudinal size to be within the range of a conventional titanium window, thereby making it possible to update and upgrade a processing equipment of the electron beam by replacing general-purpose electron beam scanning devices without changing structure of the device under the electron beam. In addition, the device consumes no electric power, and features simple structure, low cost, convenient installation, and good practicability.

The device of the invention can replace the electron beam scanning device that is widely used nowadays, in that it does not need a scanning power supply, which saves electric power, and overcomes a problem of additional cost and low operation efficiency caused by failure thereof, reduces possibility of a titanium film's damage, eliminates flyback of the electron beam, and ensures quality of products during electron beam production.

BRIEF DESCRIPTION OF THE DRAWINGS

FIG. 1(a) is a schematic view of the scanning magnet, and FIG. 1(b) illustrates operation principle of the scanning magnet;

FIG. 2(a) is a front view, and FIG. 2(b) is a side view;

FIG. 3(a) is a front view of a first group of permanent magnets, FIG. 3(b) is a side view of a first group of permanent magnets, FIG. 3(c) is a front view of a second group of permanent magnets, and FIG. 3(d) is a side view of a second group of permanent magnets;

FIG. 7(a) is a front view, and FIG. 7(b) is a side view;

DETAILED DESCRIPTION OF THE EMBODIMENTS

For clear understanding of the objectives, features and advantages of the invention, detailed description of the invention will be given below in conjunction with accompanying drawings and specific embodiments. It should be noted that the embodiments are only meant to explain the invention, and not to limit the scope of the invention.

The invention aims to improve a conventional device for diffusing an electron beam in irradiation processing. The conventional device for diffusing an electron beam in irradiation processing comprises two groups of permanent magnets, the first group of permanent magnets I comprises four magnetic poles 15, 16, 17 and 18 fixed on an upper magnetic yoke 12 and a lower magnetic yoke 14 in pairs, a polarity of a magnetic pole being different from that of another magnetic pole adjacent or opposite thereto. The first group of permanent magnets extend the electron beam in a longitudinal direction, and compress the electron beam in a transverse direction, so that the electron beam becomes an approximate ellipse. The second group of permanent magnets II comprises eight magnetic poles 25-32 fixed on an upper magnetic yoke, a lower magnetic yoke, a left magnetic yoke, and a right magnetic yoke in pairs, a polarity of a magnetic pole being different from that of another magnetic pole adjacent or opposite thereto. A magnetic field formed by the eight magnetic poles optimizes an edge of a dispersed electron-beam bunch into an approximate rectangle.

As described in the description of the related art, a longitudinal width of an electron-beam bunch obtained by the conventional device for diffusing an electron beam is greater than 400 mm, which exceeds a longitudinal size of a conventional titanium window (within 100 mm) Therefore, it is required to compress the longitudinal size of the electron-beam bunch. On the other hand, since the scanning magnet is limited by a scanning power supply, the longitudinal size can only be up to 35 mm, and a larger size may significantly affect scanning uniformity. Hence, a final irradiation width should be as large as possible in practice. The invention facilitates maximization of the titanium window's area, and optimum irradiation uniformity and efficiency without modifying an original electron accelerator by compressing the longitudinal size of the electron-beam bunch to 80 mm, taking a size of a scanning box and structure of a titanium film into account.

Figure 2:
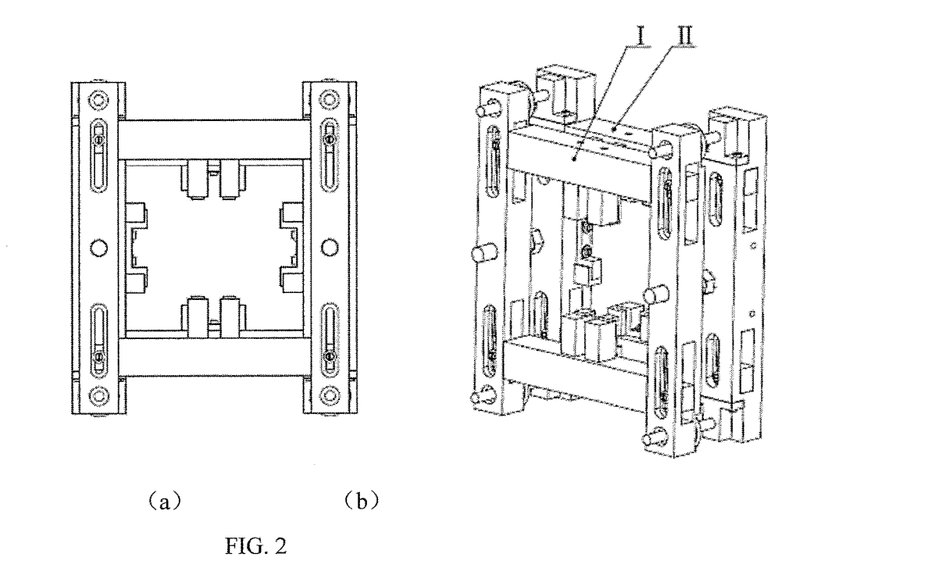
FIG. 2 is a schematic view of a device for optimizing a diffusion section of an electron beam of an exemplary embodiment of the invention.
Figure 3:
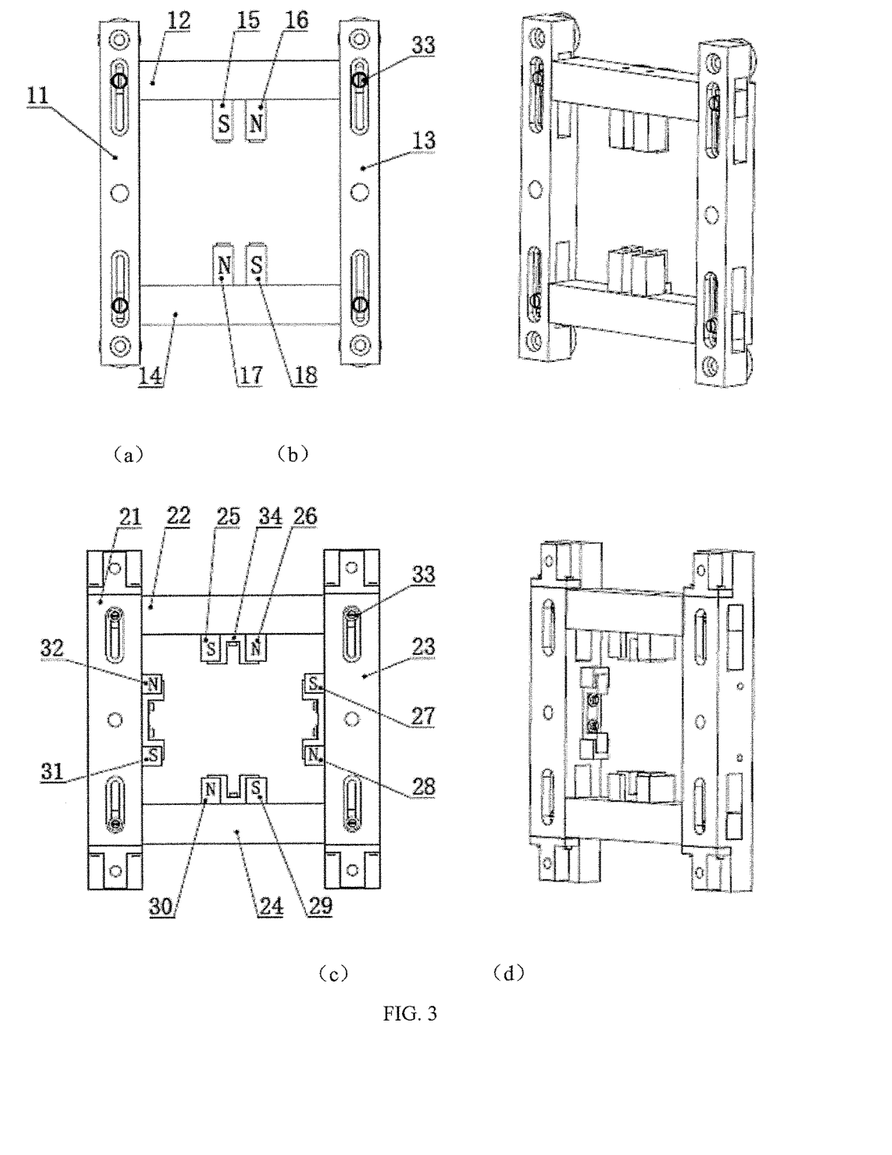
FIG. 3 is a detailed schematic view of the device of the invention.

To compress the longitudinal size of the electron-beam bunch, the invention uniformly diffuses the electron beam via the first group of permanent magnets, and longitudinally compresses the electron beam bunch for the first time; and reshapes periphery of the diffused electron beam via the second group of permanent magnets, and longitudinally compresses the electron beam bunch to 80 mm for the second time, as shown in FIGS. 2 and 3, in details:

both ends of each of the upper magnetic yoke 12 and the lower magnetic yoke 14 of the first group of permanent magnets I are respectively disposed on the left magnetic yoke 11 and the right magnetic yoke 13 via a longitudinal connection mechanism, the left magnetic yoke 11, the upper magnetic yoke 12, the right magnetic yoke 13 and the lower magnetic yoke 14 form a rectangle. Firstly the first group of permanent magnets is used for uniformly diffusing the electron beam, and then the longitudinal connection mechanism is controlled to force the upper magnetic yoke and the lower magnetic yoke to approach the center of the rectangle at the same step thereby reducing a distance between the upper magnetic pole and the lower magnetic pole, as well as the magnitude of the magnetic field, and thus longitudinally compressing the electron-beam bunch for the first time.

Both ends of each of the upper magnetic yoke 22 and the lower magnetic yoke 24 of the second group of permanent magnets II are respectively disposed on the left magnetic yoke 21 and the right magnetic yoke 23 via another longitudinal connection mechanism. The left magnetic yoke 21, the upper magnetic yoke 22, the right magnetic yoke 23 and the lower magnetic yoke 24 form a rectangle. Firstly a magnetic field formed by the second group of permanent magnets is used for reshaping periphery of the ellipse thereby forming an approximate rectangle. Then the longitudinal connection mechanism is controlled to force the upper magnetic yoke and the lower magnetic yoke to approach the center of the rectangle at the same step thereby reducing a distance between the upper magnetic pole and the lower magnetic pole, and thus longitudinally compressing the electron-beam bunch for the second time.

The first group of permanent magnets and the second group of permanent magnets cooperate with each other, and repeat the process of longitudinal compression until a longitudinal size of the electron-beam bunch is close to 80 mm. The invention uses the first group of permanent magnets as a main part, and the second group of permanent magnets as an auxiliary part, and facilitates longitudinal compression by cooperation therebetween. The principle of this is, as the electron-beam bunch is longitudinally compressed upon passing through the first group of permanent magnets, similar to convex lens, as the electron-beam bunch is diffused to the second group of permanent magnets, a movement direction and a movement speed thereof make it impossible to affect the bunch by the second group of permanent magnets.

It should be noted that as the upper magnetic yoke and the lower magnetic yoke approach the center of the rectangle, they should move at the same step, so as to ensure the electron-beam bunch is always located at the center of the compressing device, and is uniformly diffused.

Figure 4:
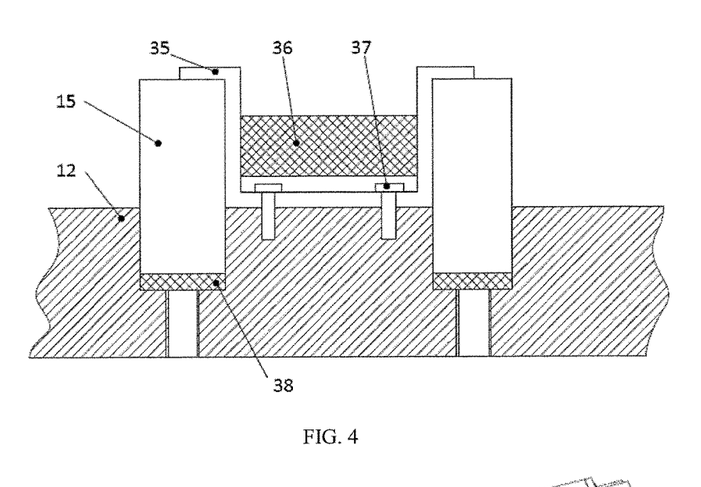
FIG. 4 is an assembly diagram of a magnetic yoke and a magnetic pole.

Installation and adjustment of the magnetic pole of the invention are shown in FIG. 4. Since machining magnetizing errors (comprising errors caused by processing technology and installation of the magnetic yoke) exist, an end of each of the magnetic poles on the same side in the vicinity of the center is not on the same horizontal plane, causing a magnetic field generated by the permanent magnet is not uniformly distributed at the center thereof, the electron-beam bunch is not uniformly diffused, and finally a diffusion section thereof cannot meet design requirement. A groove is disposed at the surface of the magnetic yoke, and interference fit with one end of the magnetic pole for receiving the magnetic pole, the groove being fixed by attractive force between the magnetic pole and the magnetic yoke, and via a fixed mount 35 made of aluminum alloy. The fixed mount 35 is fixed on the magnetic yoke via a screw 37.

A supporting block made of steel is disposed between adjacent magnetic poles on one side of the magnetic yoke, and operates to prevent the magnetic poles from deviation due to attractive force thereof. Since magnetic force between magnets is very large, the supporting block 36 is also disposed at the center of the fixed mount made of aluminum alloy outside the magnetic pole, and operates to prevent the magnetic pole from deviation due to attractive force thereof.

To adjust a position of the magnet in a direction vertical to the magnetic yoke, multiple pads 38 with different thickness (such as 1 mm, 2 mm, 5 mm and so on) are disposed in the groove, and materials forming the pad are the same as those of the magnetic yoke. Since attractive force between the magnet and the magnetic yoke is very large, a through hole is disposed at the bottom of the groove for making it easy to take the magnetic out.

Figure 5:
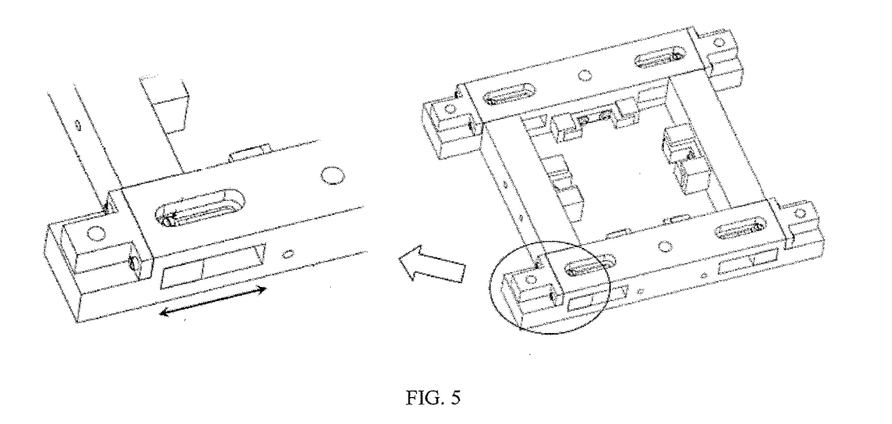
FIG. 5 is a schematic view of a longitudinal connection mechanism.

FIG. 5 illustrates the longitudinal connection mechanisms of the two groups of permanent magnets: the upper magnetic yoke and the lower magnetic yoke operate as adjusting magnetic yokes, and the left magnetic yoke and the right magnetic yoke operate as fixed magnetic yoke. A strip-form through hole is disposed on the fixed magnetic yoke, and operates to receive the magnetic yoke by adjusting both sides thereof. A position of one magnetic yoke with respect to the other magnetic yoke can be fixed by using screws. In adjustment, the screws are released, and the magnetic yokes move to a predetermined position, a position of one magnetic yoke with respect to the other is determined by a vernier caliper. Precision of this kind of adjustment can be 0.1 mm, and an adjustment range is 30 mm.

Figure 6:
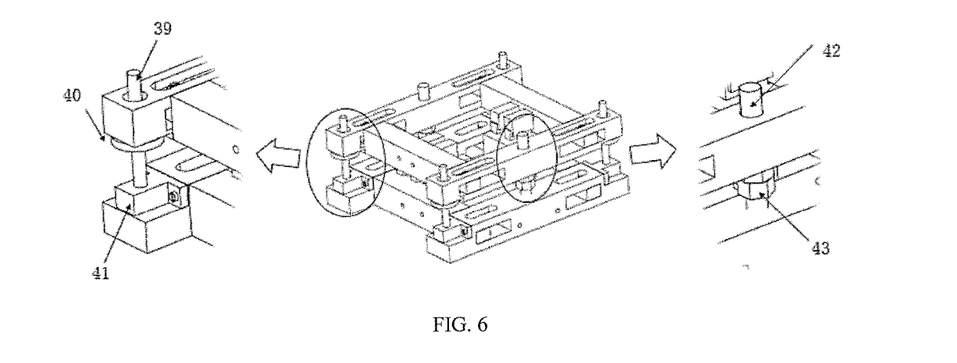
FIG. 6 illustrates adjustment of a distance between two groups of permanent magnets.

As shown in FIG. 6, four slide bars 39 correspondingly connect four corner points of the first group of permanent magnets with four corner points of the second group of permanent magnets. Specifically, a base 41 is fixed on the second group of permanent magnets, and connected to the first group of permanent magnets via the slide bar 39. A bearing 40 operates to fix a position of the first group of permanent magnets after movement.

In use, the second group of permanent magnets is fixed, and the first group of permanent magnets moves in parallel therewith via four slide bars 39, the four slide bars 39 are fixed on the second group of permanent magnets via four bases 41, four bearings 40 are disposed on four corners of the second group of permanent magnets, and fit on the slide bars, and can slide up and down thereon. Two threaded rods 42 are disposed on both sides of the second group of permanent magnets, and operate to connect the first group of permanent magnets to the second group of permanent magnets. The threaded rod is fixed via a locking mechanism 43, so as to fix said distance between the first group of permanent magnets and the second group of permanent magnets. Precision of this kind of adjustment can be up to 0.1 mm, and an adjustment range is 50 mm, which enable the invention to feature good adjustment precision, and thus facilitating uniform diffusion of the electron-beam bunch.

Figure 7:
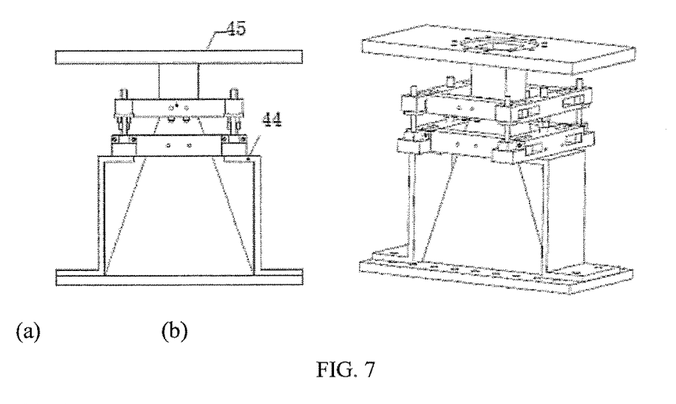
FIG. 7 is a schematic view of the device of the invention installed on an electron accelerator.

FIG. 7 illustrates installation of the device of the invention on an irradiation accelerator. The invention can be directly disposed at a scanning chamber of the accelerator for replacing a scanning magnet. A group of supporting frames 44 is disposed below a longitudinal compression device for positioning. The bottom of the supporting frame is fixedly connected to a screw of a scanning box 45, and an upper surface thereof is fixedly connected to a magnet so that the center of the magnet coincides with the screw of the scanning box, thereby facilitating good adjustment precision and stability.

Next advantages of the invention will be described using an example of applying the invention to 0.3 MeV and 0.5 MeV irradiation accelerators. A diameter of a spot of an electron beam bunch from the 0.5 MeV accelerator is 15 mm, and transverse scanning and longitudinal scanning are conducted on the electron beam after it passes through a traditional magnet, and a size of the electron-beam bunch after scanning at the titanium film is: 650 mm (length)*35 mm (width). After the electron beam passes through the device for diffusing the electron beam with a longitudinal section-compression function, a size of a diffused electron beam at the titanium window can reach 780 mm (length)*80 mm (width), which indicates the invention can greatly increase a width and a length of irradiation over a conventional scanning method.

Figure 8:
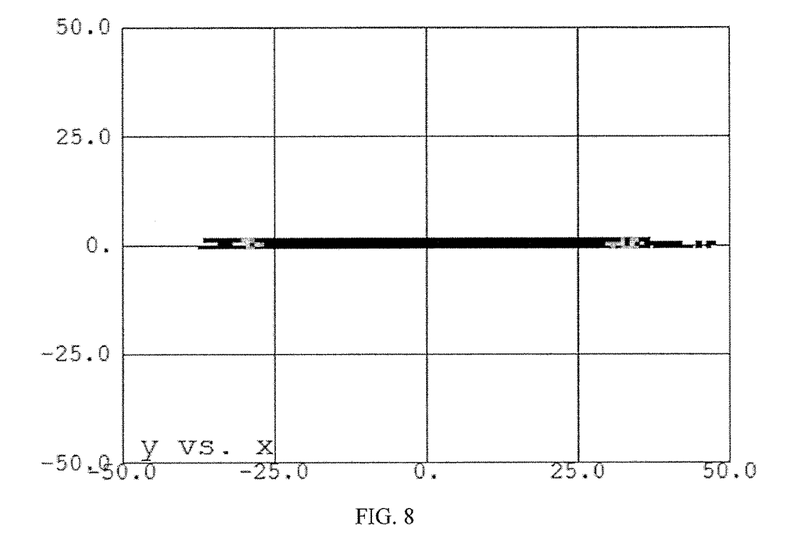
FIG. 8 illustrates distribution of electrons on an irradiated object after the electrons are diffused by the permanent magnet as the invention is applied to a 0.5 MeV accelerator.
Figure 9:
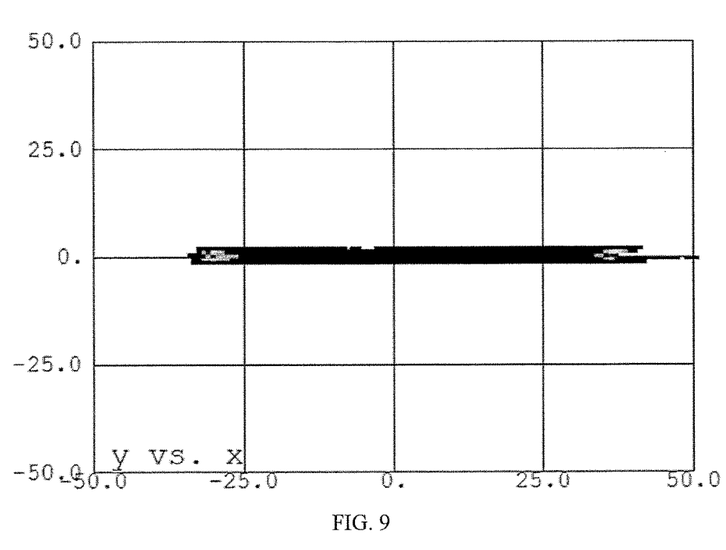
FIG. 9 illustrates distribution of electrons on an irradiated object after the electrons are diffused by the permanent magnet as the invention is applied to a 0.3 MeV accelerator.

FIGS. 8 and 9 respectively illustrates distribution of electrons on an irradiated object after the electrons are diffused by the permanent magnet as the invention is applied to 0.5 MeV and 0.3 MeV accelerators. It can be seen that if the device of the invention is fine adjusted, the invention can be applicable for accelerators with different energy, and diffuse a size of the electron-beam bunch to be within 800 mm (length)*80 mm (width).

While particular embodiments of the invention have been shown and described, it will be obvious to those skilled in the art that changes and modifications may be made without departing from the invention in its broader aspects, and therefore, the aim in the appended claims is to cover all such changes and modifications as fall within the true spirit and scope of the invention.

What is claimed is:

1. A device for optimizing a diffusion section of an electron beam, comprising:
    a first group of permanent magnets comprising four magnetic poles fixed on an upper magnetic yoke and a lower magnetic yoke in pairs, a polarity of a magnetic pole being different from that of another magnetic pole adjacent or opposite thereto, a magnetic field formed by the four magnetic poles extending an electron beam in a longitudinal direction and compressing said electron beam in a transverse direction, so that said electron beam becomes an approximate ellipse;
    a second group of permanent magnets comprising eight magnetic poles fixed on an upper magnetic yoke, a lower magnetic yoke, a left magnetic yoke, and a right magnetic yoke in pairs, a polarity of a magnetic pole being different from that of another magnetic pole adjacent or opposite thereto, a magnetic field formed by the eight magnetic poles optimizing an edge of a dispersed electron-beam bunch into an approximate rectangle;
    four longitudinal connection mechanisms, both ends of each of said upper magnetic yoke and said lower magnetic yoke of said first group of permanent magnets being respectively disposed on a left magnetic yoke and a right magnetic yoke via two of the four longitudinal connection mechanisms, both ends of each of said upper magnetic yoke and said lower magnetic yoke of said second group of permanent magnets being respectively disposed on said left magnetic yoke and said right magnetic yoke via the other two of the four longitudinal connection mechanisms;

a supporting block disposed between respective adjacent magnetic poles on said magnetic yokes of said first and second groups of permanent magnets, the supporting block being configured to prevent said respective adjacent magnetic poles from deviation due to attractive force thereof;

four slide mechanisms including slide bars, bases, and bearings, said four slide mechanisms configured to respectively connect four corner points formed by said four magnetic yokes of said first group of permanent magnets with another four corner points formed by said four magnetic yokes of said second group of permanent magnets, said first group of permanent magnets being fixed with respect to said slide bars via the bases, said second group of permanent magnets being movable along said slide bars via the bearings, thereby adjusting a distance between said first group of permanent magnets and said second group of permanent magnets; and a locking mechanism configured to fix said distance between said first group of permanent magnets and said second group of permanent magnets via threaded rods, the threaded rods disposed on both sides of said second group of permanent magnets and operate to connect said first group of permanent magnets to said second group of permanent magnets;

wherein said upper magnetic yoke and said lower magnetic yoke of said first group of permanent magnets are configured to move synchronously relative to both said left and right magnetic yokes of said first group of permanent magnets towards a center between said upper magnetic yoke and said lower magnetic yoke of said first group of permanent magnets via longitudinal connection mechanisms, and thereby longitudinally compressing said electron beam in a shape of an approximate ellipse, said upper magnetic yoke and said lower magnetic yoke of said second group of permanent magnets are configured to move synchronously relative to both said left and right magnetic yokes of said second group of permanent magnets towards a center between said upper magnetic yoke and said lower magnetic yoke of said second group of permanent magnets via longitudinal connection mechanisms, and thereby longitudinally compressing said electron beam in a shape of an approximate rectangle, and the first group and the second group of permanent magnets are configured to reduce said electron-beam bunch to 80 mm via the four longitudinal mechanism and the four slide bars.

2. The device for optimizing a diffusion section of an electron beam of claim 1, wherein said longitudinal connection mechanisms are facilitated by: an upper strip-form through hole and a lower strip-form through hole are disposed on said left magnetic yoke or said right magnetic yoke, and operate to respectively receive one end of each of said upper magnetic yoke and said lower magnetic yoke via screws, and calibration is labeled on the wall of said through holes, and allows determination of positions of said upper magnetic yoke and said lower magnetic yoke via a vernier caliper.

3. The device for optimizing a diffusion section of an electron beam of claim 1, further comprising a groove, wherein the groove is disposed at the surface of said magnetic yoke, and interference fit with one end of said magnetic pole for receiving said magnetic pole, said groove being fixed by attractive force between said magnetic pole and said magnetic yoke, and via a fixed mount made of aluminum alloy.

4. The device for optimizing a diffusion section of an electron beam of claim 3, further comprising a pad disposed between said groove and said magnetic pole.

5. A method for optimizing a diffusion section of an electron beam using a device for optimizing a diffusion section of an electron beam, wherein the device comprising:

a first group of permanent magnets comprising four magnetic poles fixed on an upper magnetic yoke and a lower magnetic yoke in pairs, a polarity of a magnetic pole being different from that of another magnetic pole adjacent or opposite thereto, a magnetic field formed by the four magnetic poles extending an electron beam in a longitudinal direction and compressing said electron beam in a transverse direction, so that said electron beam becomes an approximate ellipse;

a second group of permanent magnets comprising eight magnetic poles fixed on an upper magnetic yoke, a lower magnetic yoke, a left magnetic yoke, and a right magnetic yoke in pairs, a polarity of a magnetic pole being different from that of another magnetic pole adjacent or opposite thereto, a magnetic field formed by the eight magnetic poles optimizing an edge of a dispersed electron-beam bunch into an approximate rectangle;

four longitudinal connection mechanisms, both ends of each of said upper magnetic yoke and said lower magnetic yoke of said first group of permanent magnets being respectively disposed on a left magnetic yoke and a right magnetic yoke via two of the four longitudinal connection mechanisms, both ends of each of said upper magnetic yoke and said lower magnetic yoke of said second group of permanent magnets being respectively disposed on said left magnetic yoke and said right magnetic yoke via the other two of the four longitudinal connection mechanisms;

a supporting block disposed between respective adjacent magnetic poles on said magnetic yokes of said first and second groups of permanent magnets, the supporting block being configured to prevent said respective adjacent magnetic poles from deviation due to attractive force thereof;

four slide mechanisms including slide bars, bases, and bearings, said four slide mechanisms configured to respectively connect four corner points formed by said four magnetic yokes of said first group of permanent magnets with another four corner points formed by said four magnetic yokes of said second group of permanent magnets, said first group of permanent magnets being fixed with respect to said slide bars via said bases, said second group of permanent magnets being movable along said slide bars via said bearings, thereby adjusting a distance between said first group of permanent magnets and said second group of permanent magnets; and a locking mechanism configured to fix said distance between said first group of permanent magnets and said second group of permanent magnets, the method comprising:

conducting a first longitudinal compression to compress an electron beam in a shape of an approximate ellipse by moving said upper magnetic yoke and said lower magnetic yoke of said first group of permanent magnets synchronously relative to both said left and right magnetic yokes of said first group of permanent magnets towards a center between said upper magnetic yoke and said lower magnetic yoke of said first group of permanent magnets;

conducting a second longitudinal compression to compress said electron beam in a shape of an approximate rectangle by moving said upper magnetic yoke and said lower magnetic yoke of said second group of permanent magnets synchronously relative to both said left and right magnetic yokes of said second group of permanent magnets towards a center between said upper magnetic yoke and said lower magnetic yoke of said second group of permanent magnets; and repeating the first and the second longitudinal compression until a longitudinal size of said electron beam is reduced to 80 mm.

\* \* \* \* \*